United States Patent
Uhlig et al.

(10) Patent No.: US 9,076,773 B2
(45) Date of Patent: Jul. 7, 2015

(54) WIRE BONDABLE SURFACE FOR MICROELECTRONIC DEVICES

(75) Inventors: Albrecht Uhlig, Berlin (DE); Josef Gaida, Berlin (DE); Christof Suchentrunk, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/125,611

(22) PCT Filed: May 9, 2012

(86) PCT No.: PCT/EP2012/058572
§ 371 (c)(1),
(2), (4) Date: Jan. 9, 2014

(87) PCT Pub. No.: WO2012/171727
PCT Pub. Date: Dec. 20, 2012

(65) Prior Publication Data
US 2014/0110844 A1      Apr. 24, 2014

(30) Foreign Application Priority Data

Jun. 14, 2011   (EP) .................................. 11169737

(51) Int. Cl.
*H01L 23/482*   (2006.01)
*H01L 23/00*    (2006.01)

(52) U.S. Cl.
CPC ............ *H01L 23/4827* (2013.01); *H01L 24/03* (2013.01); *H01L 24/05* (2013.01); *H01L 2224/05124* (2013.01); *H01L 2224/05147* (2013.01); *H01L 2224/05157* (2013.01); *H01L 2224/05164* (2013.01); *H01L 2224/05644* (2013.01); *H01L 2224/05664* (2013.01); *H01L 2924/01013* (2013.01); *H01L 2924/01025* (2013.01); *H01L 2924/01029* (2013.01); *H01L 2924/0103* (2013.01); *H01L 2924/01033* (2013.01); *H01L 2924/01051* (2013.01); *H01L 2924/01061* (2013.01); *H01L 2924/01073* (2013.01); *H01L 2924/01079* (2013.01); *H01L 2924/01082* (2013.01); *H01L 2924/014* (2013.01); *H01L 2924/01005* (2013.01); *H01L2924/01006* (2013.01); *H01L 2924/01019* (2013.01); *H01L 2924/01024* (2013.01); *H01L 2924/0104* (2013.01); *H01L 2924/01042* (2013.01); *H01L 2924/0105* (2013.01); *H01L 2924/01074* (2013.01); *H01L 2924/01075* (2013.01)

(58) Field of Classification Search
CPC ...................................................... H01L 23/482
USPC ......................................................... 257/751
See application file for complete search history.

(56) References Cited

U.S. PATENT DOCUMENTS

| | | | |
|---|---|---|---|
| 6,335,104 B1 * | 1/2002 | Sambucetti et al. | 428/615 |
| 2005/0275100 A1 | 12/2005 | Yakobson et al. | |
| 2008/0122091 A1 | 5/2008 | Gutt et al. | |
| 2008/0251940 A1 * | 10/2008 | Lee et al. | 257/777 |
| 2010/0258954 A1 * | 10/2010 | Andoh | 257/784 |
| 2011/0101526 A1 * | 5/2011 | Hsiao et al. | 257/738 |
| 2011/0108876 A1 * | 5/2011 | Yen | 257/99 |

OTHER PUBLICATIONS

PCT/EP2012/058572; PCT International Search Report and Written Opinion of the International Searching Authority dated Jun. 4, 2012.

* cited by examiner

*Primary Examiner* — Kevin Parendo
*Assistant Examiner* — Lamont Koo
(74) *Attorney, Agent, or Firm* — Renner, Otto, Boisselle & Sklar, LLP

(57) ABSTRACT

The present invention concerns thin diffusion barriers in metal and metal alloy layer sequences of contact area/barrier layer/first bonding layer type for metal wire bonding applications. The diffusion barrier is selected from Co-M-P, Co-M-B and Co-M-B—P alloys wherein M is selected from Mn, Zr, Re, Mo, Ta and W having a thickness in the range 0.03 to 0.3 μm. The first bonding layer is selected from palladium and palladium alloys.

2 Claims, 2 Drawing Sheets

WIRE BONDABLE SURFACE FOR MICROELECTRONIC DEVICES

The present application is a U.S. National Stage Application based on and claiming benefit and priority under 35 U.S.C. §371 of International Application No. PCT/EP2012/058572, filed 9 May 2012, which in turn claims benefit of and priority to European Application No. 11169737.1, filed 14 Jun. 2011, the entirety of each of which is hereby incorporated herein by reference.

FIELD OF THE INVENTION

The present invention relates to metal and metal alloy layer sequences on semi-conducting substrates for metal wire bonding applications.

BACKGROUND OF THE INVENTION

Microelectronic devices made of semiconducting substrates such as silicon wafers comprise contact areas on the outer surface which are utilized to provide electrical contacts between the microelectronic device and an IC substrate or a printed circuit board. Such contact areas which can be either in the form of contact pads or bump structures usually consist of copper, copper alloys, aluminium or aluminium alloys. In order to provide such an electrical contact soldering and wire bonding are applied.

In both cases the contact areas must be prepared to provide solderability and bondability by depositing metal or metal alloy layers on top of the contact areas which provide functionalities of a barrier layer and a first and/or second bondable surface.

The barrier layer prevents diffusion between the contact areas and the first and/or second bonding layer during soldering or wire bonding. Furthermore, a barrier layer provides mechanical protection to sensitive parts of the microelectronic device beneath the contact areas by providing a hard "shielding layer". This function is especially demanded in wire bonding operations wherein a thin gold or copper wire is pressed onto the contact pad during bonding.

U.S. Pat. No. 6,815,789 B2 discloses at least one layer comprising at least one of nickel, palladium and alloys thereof. The nickel (alloy) layer serves as a barrier layer. The thickness of said nickel (alloy) layer should be at least 1 µm to provide sufficient barrier properties.

US 2001/0033020 A1 discloses a barrier layer selected from nickel, cobalt, chromium, molybdenum, titanium, tungsten and alloys thereof having a thickness of 0.5 to 1.5 µm.

U.S. Pat. No. 6,445,069 B1 discloses a barrier layer made of nickel having a thickness in the range of 0.5 to 20 µm.

Due to the ongoing miniaturisation of microelectronic devices the distance between individual contact areas (denoted "pitch") is reduced. At the same time the risk of bridging, i.e. an undesired electrical contact between contact areas is increasing. Bridging is caused by thick barrier layers deposited onto the contact areas.

Wire bonding is associated with application of a force onto a contact area having a bondable surface because the wire is pressed onto the bondable surface during bonding.

When reducing the thickness of a barrier layer such bridging can be minimised. However, at the same time the mechanical protection of sensitive regions beneath the contact area during wire bonding is not sufficient anymore and device failures caused by wire bonding are observed.

OBJECTIVE OF THE INVENTION

Therefore it is the objective of the present invention to provide a metal and metal alloy layer sequence having a wire bondable surface which reduces the risk of bridging between contact areas and at the same time provides a sufficient mechanical stability for sensitive regions of the microelectronic device beneath the contact areas during wire bonding.

SUMMARY OF THE INVENTION

These objectives are solved with a semiconducting substrate comprising at least one metal and metal alloy layer sequence with a metal wire bondable surface wherein said layer sequence consists in this order of
(i) a contact area,
(ii) a barrier layer selected from the group consisting of a cobalt alloy selected from the group consisting of Co-M-B, Co-M-P and Co-M-B—P alloys
wherein M is selected from the group consisting of Mn, Zr, Re, Mo, Ta and W and the thickness of said barrier layer ranges from 0.03 to 0.3 µm and
(ii) a first bonding layer selected from palladium and palladium alloys having a thickness in the range of 0.05 to 0.3 µm.

The ternary or quaternary cobalt alloy is more preferably selected from the group consisting of Co—Mo—P, Co—W—P, Co—Mo—B, Co—W—B, Co—Mo—B—P and Co—W—B—P alloys.

A metal and metal alloy layer sequence according the present invention reduces the risk of bridging due to the lower thickness of the barrier layer. At the same time such a metal and metal alloy layer sequence provides enough mechanical stability to prevent damage of sensitive regions beneath the contact areas during metal wire bonding operations.

DETAILED DESCRIPTION OF THE INVENTION

Figure 1:
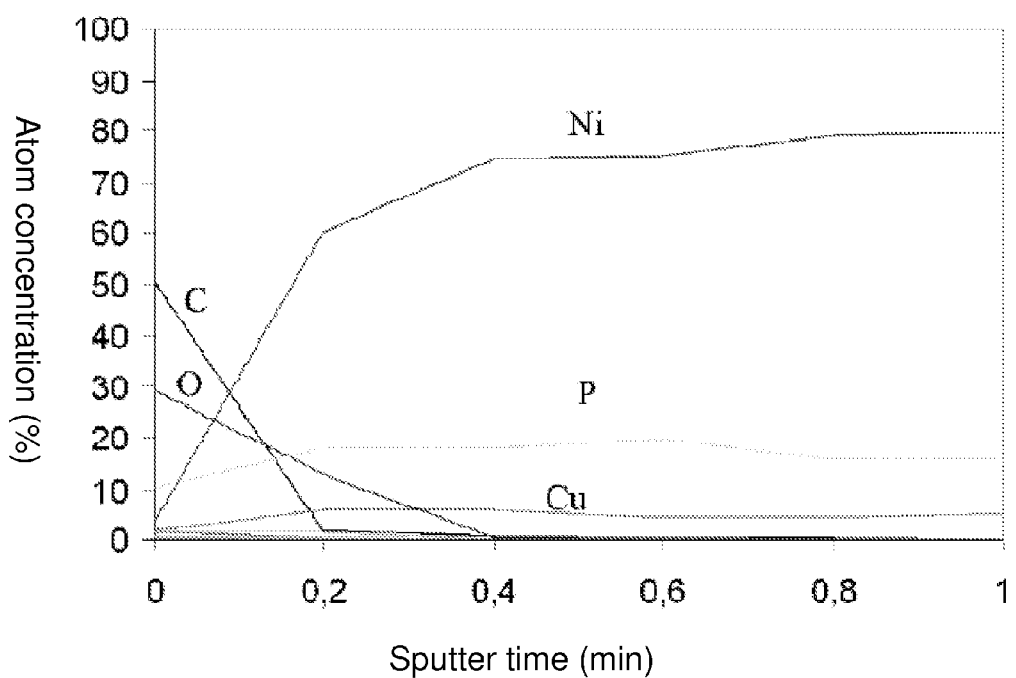
FIG. 1 shows the distribution of chemical elements of a metal and metal alloy layer sequence consisting of a Ni—P alloy barrier layer on top of a contact area made of copper after thermal annealing at 500° C. for 8 h.
Figure 2:
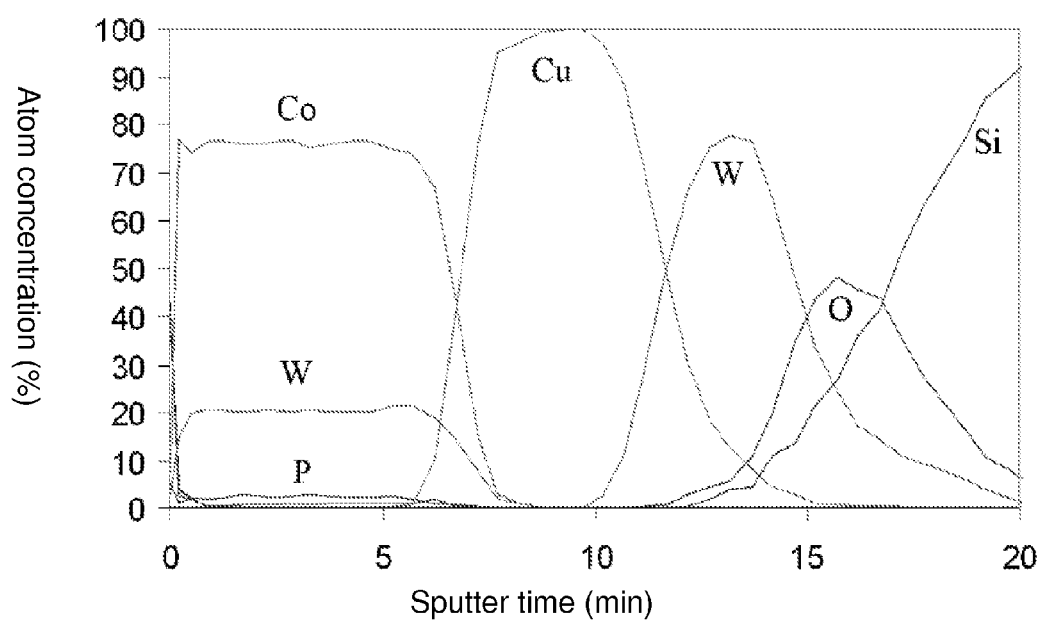
FIG. 2 shows the distribution of chemical elements of a metal and metal alloy layer sequence consisting of a Co—W—P alloy barrier layer on top of a contact area made of copper after thermal annealing at 500° C. for 8 h.

The copper or copper alloy surface of the contact area usually is prepared for plating of the barrier layer by prior treatment with an acid cleaner and then the surface copper oxides are reduced in a micro-etch bath. For this purpose, etch cleaning is usually carried out in oxidizing, acidic solutions, for example a solution of sulfuric acid and hydrogen peroxide. Preferably, this is followed by another cleaning in an acidic solution, such as, for example, a sulfuric acid solution.

For a pre-treatment of aluminum and aluminum alloys different zincations are available, for example Xenolyte® cleaner ACA, Xenolyte® Etch MA, Xenolyte® CFA or Xenolyte® CF (all available from Atotech Deutschland GmbH) which fulfil the industry standards of cyanide-free chemistry. Such pre-treatment methods for aluminum and aluminum alloys are for example disclosed in U.S. Pat. No. 7,223,299 B2.

For the purpose of the present invention it can be useful to apply an additional activation step to the contact areas prior to depositing the ternary or quaternary cobalt alloy diffusion barrier layer. Such activation solution can comprise a palladium salt which results in a thin palladium layer. Such layer is very thin and usually does not cover the entire copper or copper alloy wire bonding portion. It is not considered a distinct layer of the layer assembly but rather an activation, which forms a metal seed layer. Such seed layer is typically a few angstroms in thickness. Such seed layer is plated to the copper or copper alloy layer by an immersion exchange process.

Next, a ternary or quaternary cobalt alloy selected from Co-M-P, Co-M-B and Co-M-B—P alloys is deposited onto the activated contact area by electroless plating. M is selected from the group comprising Mn, Zr, Re, Mo, Ta and W. More preferably, M is selected from the group consisting of Mo and W.

The thickness of the ternary of quaternary cobalt alloy ranges from 0.03 to 0.3 µm, more preferably from 0.05 to 0.25 µm.

The ternary of quaternary cobalt alloy is preferably selected from the group consisting of Co—Mo—P, Co—W—P, Co—Mo—B, Co—W—B, Co—Mo—B—P and Co—W—B—P alloys and most preferably selected from Co—Mo—P and Co—W—P alloys.

Suitable cobalt alloy plating solutions comprise cobalt salt, and a reducing agent such as hypophosphorous acid or a bath soluble salt thereof selected from sodium hypophosphite, potassium hypophosphite and ammonium hypophosphite. This solution should be free of alkali or alkaline earth metal ions capable of forming an insoluble orthophosphite. Other suitable plating baths comprise a reducing agent selected from borane compounds or a mixture of a borane and a hypophosphite compounds.

In case a hypophosphite compound is used as the reducing agent a Co-M-P alloy deposit is obtained. A borane compound reducing agent leads to a Co-M-B alloy deposit and a mixture of hypophosphite and borane compounds as the reducing agents leads to a Co-M-B—P alloy deposit.

The plating bath further contains a source of M-ions. Suitable sources are selected from the group comprising water soluble molybdates and wolframates such as $Na_2MoO_4$ and $Na_2WO_4$. The amount of M-ions added to the plating bath ranges from 5 to 20 g/l, more preferably from 8 to 12 g/l.

In the electroless cobalt alloy solutions the operating cobalt ion concentration is typically from 1 to 18 g/l, preferably 3 to 9 g/l.

The amount of the reducing agent employed in the plating bath ranges from 2 to 60 g/l, more preferably from 12 to 50 g/l and most preferably from 20 to 45 g/l. As a conventional practice the reducing agent is replenished during the reaction.

The complexing agents are employed in amounts of up to 200 g/l, more preferably from 15 to 75 g/l.

In one embodiment, carboxylic acids, polyamines or sulfonic acids or mixtures thereof are selected as complexing agents. Useful carboxylic acids include the mono-, di-, tri- and tetra-carboxylic acids. The carboxylic acids may be substituted with various substituent moieties such as hydroxy or amino groups and the acids may be introduced into the plating solutions as their sodium, potassium or ammonium salts. Some complexing agents such as acetic acid, for example, may also act as a buffering agent, and the appropriate concentration of such additive components can be optimised for any plating solution in consideration of their dual functionality.

Examples of such carboxylic acids which are useful as the complexing agents include: monocarboxylic acids such as acetic acid, hydroxyacetic acid (glycolic acid), aminoacetic acid (glycine), 2-amino propanoic acid, (alanine); 2-hydroxy propanoic acid (lactic acid); dicarboxylic acids such as succinic acid, amino succinic acid (aspartic acid), hydroxy succinic acid (malic acid), propanedioic acid (malonic acid), tartaric acid; tricarboxylic acids such as 2-hydroxy-1,2,3 propane tricarboxylic acid (citric acid); and tetracarboxylic acids such as ethylene diamine tetra acetic acid (EDTA). In one embodiment, mixtures of 2 or more of the above complexing agents are utilised.

The aqueous electroless plating baths can be operated over the above mentioned pH range. Since the plating solution has a tendency to become more acidic during its operation due to the formation of hydrogen ions, the pH may periodically or continuously be adjusted by adding bath-soluble and bath-compatible alkaline substances such as sodium, potassium or ammonium hydroxides, carbonates and bicarbonates. The stability of the operating pH of the plating solutions can be improved by the addition of various buffer compounds such as acetic acid, propionic acid, boric acid, or the like, in amounts of up to 30 g/l, more preferably from 2 to 10 g/l.

The electroless plating solutions also include organic and/or inorganic stabilising agents of the types heretofore known in the art including lead ions, cadmium ions, tin ions, bismuth ions, antimony ions and zinc ions which can be conveniently introduced in the form of bath soluble and compatible salts such as the acetates, etc. Organic stabilisers useful in electroless plating solutions include sulfur-containing compounds such as, for example, thiourea, mercaptanes, sulfonates, thiocyanates, etc. The stabilisers are used in small amounts such as from 0.05 to 5 ppm of solution, and more preferably in amounts of 0.1 to 2 or 3 ppm.

The substrate to be plated is contacted with the plating solution at a temperature of at least 40° C. up to the boiling point of the solution. Electroless plating baths of an acidic type are employed, in one embodiment, at a temperature of from 70° C. to 95° C., and more preferably, at a temperature of from 80° C. to 90° C. Electroless plating baths on the alkaline side generally are operated within the broad operating range but generally at a lower temperature than the acidic electroless plating solutions.

The duration of contact of the electroless plating solution with the substrate being plated is a function which is dependent on the desired thickness of the deposited cobalt alloy. Typically, the contact time can range from 5 to 10 min.

During the deposition of the cobalt alloy, mild agitation generally is employed, and this agitation may be a mild air agitation, mechanical agitation, bath circulation by pumping, rotation of the substrate to be plated, etc. The plating solution may also be subjected to a periodic or continuous filtration treatment to reduce the level of contaminants therein. Replenishment of the constituents of the bath may also be performed, in some embodiments, on a periodic or continuous basis to maintain the concentration of constituents, and in particular, the concentration of cobalt ions and M-ions and hypophosphite ions, as well as the pH level within the desired limits.

The substrate is then rinsed, preferably with water.

Next, a layer of palladium or a palladium alloy is deposited onto the layer of a ternary or quaternary cobalt alloy.

A palladium layer according to the present invention is a layer having a palladium content of more than 99.0 wt.-%, preferred more than 99.5 wt.-% palladium or even more preferred more than 99.9 wt.-% or more than 99.99 wt.-%. palladium. Such a palladium layer is denoted herein as a pure palladium layer.

In another embodiment of the method, the palladium plated layer is an alloy layer which comprises 90 to 99.9 wt. % of palladium, and 0.1 to 10.0 wt.-% of phosphorus and/or boron.

A suitable chemical plating bath composition to deposit layers of pure palladium is for example described in U.S. Pat. No. 5,882,736. Such a plating bath contains a palladium salt, one or more nitrogenated complexing agents, and formic acid or formic acid derivatives, but not hypophosphite and/or amine borane compounds. The pH value of the solution is above 4. Preferably, primary, secondary or tertiary amines or polyamines are used as the nitrogenated complexing agents. They are, for example, ethylene-diamine; 1,3-diamino-propane, 1,2-bis(3-aminopropyl-amino)-ethane; 2-diethyl-amino-ethyl-amine; and diethylene-triamine. In addition, diethylene-triamine-penta-acetic acid; nitro-acetic acid; N-(2-hydroxy-ethyl)-ethylene-diamine; ethylene-diamine-N,N-diacetic acid; 2-(dimethyl-amino)-ethyl-amine; 1,2-di-amino-propyl-amine; 1,3-diamino-propyl-amine; 3-(methyl-amino)-propyl-amine; 3-(dimethyl-amino)-propyl-amine; 3-(diethyl-amino)-propyl-amine; bis(3-amino-propyl)-amine; 1,2-bis(3-amino-propyl)-alkyl-amine; diethylene-triamine; triethylene-tetramine; tetra-ethylene-pentamine; penta-ethylene-hexamine; and any desired mixtures of these nitrogenated complexing agents may also be used. However, sulfur containing compounds are not used as stabilizers together with the complexing agents.

More preferably the solution used to deposit the pure palladium layer in an electroless manner is aqueous and contains a palladium salt, such as palladium chloride or palladium sulfate, a non-hypophosphite containing compound as a reducing agent like formic acid, mineral acids, such as sulfuric acid and hydrochloric acid, or mineral bases, like sodium or potassium hydroxide, complexing agents, like amine compounds, such as ethylene diamine, and, if necessary, stabilizing compounds. Alternatively, other electroless palladium and palladium alloy deposition solutions and processes may be used which are well-known in the art and which are described in: U.S. Pat. No. 5,292,361, U.S. Pat. No. 4,424,241, U.S. Pat. No. 4,341,846, U.S. Pat. No. 4,279,951 and U.S. Pat. No. 4,255,194.

The palladium or palladium alloy plating process is conducted at about 45 to 80° C. for 1 to 60 min to give a palladium or palladium alloy plated layer ranging in thickness from 0.05 to 0.3 µm, more preferably from 0.1 to 0.2 µm.

Preferably, pure palladium is deposited onto the ternary or quaternary cobalt alloy.

Optionally, a thin layer of gold or a gold alloy is plated onto the layer of pure palladium or palladium alloy serving as a second bonding layer.

For this purpose, electroless gold plating electrolytes known from prior art can be used. The thickness of the optional gold layer on top of the pure palladium or palladium alloy layer is 0.01 to 0.5 µm, preferably 0.05 to 0.3 µm. The optional gold layer is most preferably deposited by an immersion process. A suitable bath for electroless gold plating is available commercially under the trademark Aurotech® SFplus (T=80 to 90° C.; pH=4.5 to 6.0; immersion time=7 to 15 min; 0.5 to 2 g/l Au (as K[Au(CN)$_2$]).

EXAMPLES

The invention will now be illustrated by reference to the following non-limiting examples.

Example 1 (Comparative)

A nickel phosphorous alloy was deposited by electroless plating onto contact pads made of copper. The thickness of said nickel phosphorous alloy was 1.0 µm and the phosphorous concentration was 12 wt.-% after deposition.

The substrate was then annealed for 8 h at 500° C.

The diffusion behaviour of copper into the nickel phosphorous alloy (and vice versa) was determined using a XPS measurement coupled with ablation of the layer(s).

A copper content of 3 to 5 at.-% was observed after the annealing step in the nickel phosphorous alloy layer.

Hence, a thin nickel phosphorous alloy layer does not prevent copper diffusion at an elevated temperature.

Example 2

A Co—W—P alloy was deposited by electroplating onto contact pads made of copper. The thickness of said Co—W—P alloy was 0.2 µm and the phosphorous concentration was 3 wt.-% after deposition.

Thermal annealing and XPS measurement were performed as described in Example 1.

A negligible amount of copper was detected in the Co—W—P alloy layer after thermal annealing.

Hence, a thin Co—W—P alloy layer does prevent copper diffusion at an elevated temperature.

Example 3

A Co—W—P alloy was deposited by electroplating onto contact pads made of copper. The thickness of said Co—W—P alloy was 0.2 µm and the phosphorous concentration was 3 wt.-% after deposition.

Next, an intermediate layer of pure palladium (thickness: 0.3 µm) and thereafter a top layer of gold (thickness: 0.03 µm) was deposited onto the palladium layer.

The wire bonding properties of the final metal and metal alloy layer sequence consisting of a copper contact pad, a Co—W—P alloy layer, a palladium layer having a palladium content of more than 99 wt.-% and a gold layer were determined using the DVS Standard No 2811.

A TS bonder model Delvotec 5410 and a gold wires Au-AH3 (Hereaus) and bonding parameters US power 75% (graduation marks (not calibrated marks), specific parameter for given TS bonder); 25 gf bonding force and 25 ms bonding time were used. Measurements were done for 30 stud bumps per pad size.

The following parameters were determined during the bonding test:
Mean Value: 65.8 g
Standard Deviation: 7.5 g
Minimum Value: 55.4 g
Shear Lift Off: 0%
Shear Force>35 cN: 0%

All obtained values are in the frame of the DVS standard No. 2811 and its requirements. Hence, a thin Co—W—P alloy is a suitable diffusion barrier for wire bonding applications using a pure palladium/gold finish.

The invention claimed is:
1. A semiconducting substrate comprising at least one metal layer sequence to produce a metal wire bondable surface wherein said layer sequence consists in this order of
   (i) a plurality of adjacent contact areas, wherein the adjacent contact areas are positioned within 5 µm of each other,
   (ii) a barrier layer selected from the group consisting of Co—Mo—P, Co—W—P, Co—Mo—B, Co—W—B, Co—Mo—B—P or Co—W—B—P alloys,
wherein the thickness of said barrier layer ranges from 0.05 to 0.15 µm and
   (iii) pure palladium as a first bonding layer having a thickness in the range of 0.05 to 0.3 µm,
wherein the stack further comprises a second bonding layer on top of the first bonding layer, the second bonding layer is selected from the group consisting of gold and gold alloys, and the thickness of the second bonding layer ranges from 0.02 to 0.1 µm, wherein a total thickness of said layer sequence is sufficient to provide both reduced risk of bridging and sufficient mechanical stability to prevent damage to the substrate during metal wire bonding operations.

2. The semiconducting substrate according to claim 1 wherein the thickness of the first bonding layer ranges from 0.1 to 0.2 µm.

* * * * *